United States Patent
Haminton, II et al.

(10) Patent No.: US 10,003,354 B2
(45) Date of Patent: Jun. 19, 2018

(54) DIGITAL MEDIA USAGE IN RESPONSE TO IMPACT DATA

(71) Applicant: International Business Machines Corporation, Armonk, NY (US)

(72) Inventors: Rick A. Haminton, II, Charlottesville, VA (US); Paul A. Moskowitz, Yorktown Heights, NY (US); Brian M. O'Connell, Cary, NC (US); Clifford A. Pickover, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1227 days.

(21) Appl. No.: 13/792,371

(22) Filed: Mar. 11, 2013

(65) Prior Publication Data
US 2013/0190910 A1 Jul. 25, 2013

Related U.S. Application Data

(63) Continuation of application No. 12/333,358, filed on Dec. 12, 2008, now Pat. No. 8,429,036.

(51) Int. Cl.
| | |
|---|---|
| G06Q 99/00 | (2006.01) |
| H03M 7/30 | (2006.01) |
| H04N 5/445 | (2011.01) |
| H04N 21/235 | (2011.01) |
| H04N 21/435 | (2011.01) |
| H04N 21/482 | (2011.01) |

(Continued)

(52) U.S. Cl.
CPC .......... *H03M 7/30* (2013.01); *H04N 5/44508* (2013.01); *H04N 21/235* (2013.01); *H04N 21/435* (2013.01); *H04N 21/482* (2013.01); *H04N 21/84* (2013.01); *H04N 21/85403* (2013.01)

(58) Field of Classification Search
CPC ............ H04N 5/44508; H04N 21/235; H04N 21/435; H04N 21/482; H04N 21/84; H04N 21/85403; H03M 7/30; G06Q 30/018
USPC ...... 705/1.1, 7.11, 14.1, 14.23, 14.37, 14.38, 705/14.39, 16, 26.1, 27.1, 27.2, 29, 30, 705/32, 34, 37, 317
See application file for complete search history.

(56) References Cited

U.S. PATENT DOCUMENTS

| | | |
|---|---|---|
| 7,092,851 B2 | 8/2006 | Ichikawa et al. |
| 7,996,164 B2 | 8/2011 | Hamilton et al. |
| | (Continued) | |

FOREIGN PATENT DOCUMENTS

AU        2007100542 A4    12/2007

OTHER PUBLICATIONS

U.S. Appl. No. 12/333,358, filed Dec. 12, 2008; GAU 3628; Confirmation No. 6172.

(Continued)

*Primary Examiner* — Igor Borissov
(74) *Attorney, Agent, or Firm* — Patrick J. Daugherty; Driggs, Hogg, Daugherty & Del Zoppo Co., LPAx

(57) ABSTRACT

Aspects provide digital media content as a function of embedded environmental impact data. When a digital multimedia item is received, an embedded environmental impact value is decoded and the item is utilized as a function of the decoded embedded environmental impact value. Some aspects account for amounts and types of energy used in creating the item to calculate an environmental impact value for the item, and the calculated environmental impact value is embedded within digital data of the item.

20 Claims, 3 Drawing Sheets

(51) Int. Cl.
*H04N 21/84* (2011.01)
*H04N 21/854* (2011.01)

(56) References Cited

U.S. PATENT DOCUMENTS

| | | |
|---|---|---|
| 2003/0146924 A1 | 8/2003 | Svensson et al. |
| 2007/0250195 A1 | 10/2007 | Rhoads et al. |
| 2009/0063211 A1 | 3/2009 | Campo et al. |
| 2009/0132394 A1 | 5/2009 | Gosakan |
| 2009/0248854 A1 | 10/2009 | Conway |
| 2009/0254387 A1 | 10/2009 | Daken et al. |
| 2009/0278841 A1 | 11/2009 | Hamilton, II et al. |
| 2009/0281886 A1 | 11/2009 | Castelli et al. |
| 2009/0292617 A1 | 11/2009 | Sperling et al. |
| 2009/0313060 A1 | 12/2009 | Eversky |
| 2010/0050004 A1 | 2/2010 | Hamilton et al. |

OTHER PUBLICATIONS

Non-Final Office Action (dated Aug. 27, 2012) for U.S. Appl. No. 12/333,358, filed Dec. 12, 2008; GAU 3628, Confirmation No. 6172.

Response (File Date Nov. 27, 2012) to Non-Final Office Action (dated Aug. 27, 2012) for U.S. Appl. No. 12/333,358, filed Dec. 12, 2008; GAU 3628, Confirmation No. 6172.

Notice of Allowance (dated Dec. 13, 2012 for U.S. Appl. No. 12/333,358, filed Dec. 12, 2008; GAU 3628, Confirmation No. 6172.

DIGITAL MEDIA USAGE IN RESPONSE TO IMPACT DATA

FIELD OF THE INVENTION

The present invention generally describes methods, systems and devices for utilizing digital media as a function of environmental impact data.

BACKGROUND OF THE INVENTION

The production, transmission and use of digital multimedia content by producers, consumers and other users requires the use of powered electronic programmable components, including computers, personal digital assistants (PDA's), flash memory music players, gaming machines, etc., each of which in turn requires the use of electrical energy. Considered cumulatively, the use of powered electronic components in accessing, providing, receiving or manipulating digital media requires significant amounts of energy. Depending on the source of the consumed energy, such usage may also increase greenhouse gas emissions, which are generally believed to cause negative environmental impacts such as causing changes in world atmospheric temperatures ("global climate change"). Public and private initiatives are underway to identify ways to reduce the use of energy by electronic powered devices and components.

Green computing has been defined as the study and practice of using computing resources efficiently, and includes efforts to obtain maximized energy efficiency from computer resources being used. Typically, technological systems or computing products that incorporate green computing principles take into account economic viability, social responsibility and environmental impact. Environmental impact generally refers to the impact on the earth's resources from a given activity, and calculating a given impact includes the consideration of many factors, illustratively including the use of recycled materials, power used during the transport and package of items, overall power use, power used by computers which in turn used to operate a product distribution system, recyclability of products, presence of heavy metals in product, and carbon footprints, which are sometimes defined as a measure of the impact of a given activity on the environment in terms of an amount of green house gases produced as measured in units of carbon dioxide, though it may also contemplate the production of other impact emissions such as methane and hydro fluorocarbons (HFCs).

SUMMARY OF THE INVENTION

Methods are provided for providing digital media content as a function of embedded environmental impact data. When a digital multimedia item is received, an embedded environmental impact value is decoded and the item is utilized as a function of the decoded embedded environmental impact value. Some methods further comprise accounting for amounts and types of energy used in creating the item to calculate an environmental impact value for the item, and the calculated environmental impact value embedded within digital data of the item.

Service methods are also provided comprising deploying applications for utilizing digital media as a function of embedded environmental impact data according to the method steps described above, for example by a service provider who offers to implement, deploy, and/or perform functions for others. Still further, articles of manufacture comprising a computer usable medium having a computer readable program in said medium are provided. Such program code comprises instructions which, when executed on a computer system, cause the computer system to perform one or more method and/or process elements described above for utilizing digital media as a function of embedded environmental impact data. Moreover, systems, articles and programmable devices are also provided, configured for performing one or more method and/or process elements of the current invention for utilizing digital media as a function of embedded environmental impact data, for example as described above.

BRIEF DESCRIPTION OF THE DRAWINGS

These and other features of the methods, systems and devices according to the present application will be more readily understood from the following detailed description of the various aspects of the embodiments taken in conjunction with the accompanying drawings in which.

Figure 1:
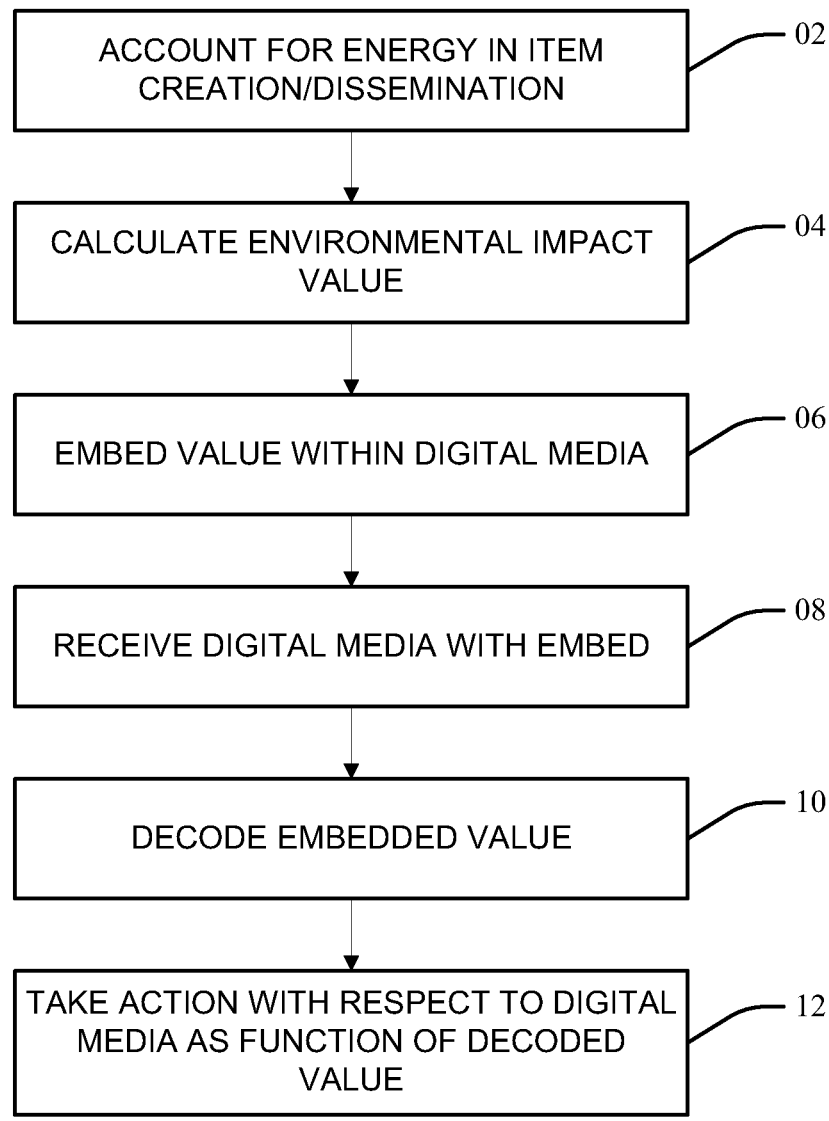
FIG. 1 is a flow chart illustrating a method and system for utilizing digital media as a function of embedded environmental impact data according to the present invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

For convenience the Detailed Description of the Invention has the following sections:
I. General Description; and
II. Computerized Implementation.

I. General Description

The present application discloses systems, methods, and devices for utilizing digital media as a function of embedded environmental impact data. FIG. 1 illustrates one embodiment of the present invention, wherein at 02 the amount of energy used in the creating of a digital multimedia item is accounted for or otherwise determined. At 04 an environmental impact value is calculated for the item as a function of the accounted energy amount, and at 06 calculated impact value data is embedded within digital data of the first item. In response to receipt of the item at 08, at 10 a receiver decodes the embedded environmental impact value data and as a function of the decoding decides at 12 whether or not to utilize the received item (e.g. either using or not using the received item, or another digital media item).

The present invention provides systems and processes enabled for monitoring energy-efficient production, dissemination, and use attributes of digital multimedia content, and further provides for convenient and/or automatic digital labeling of such media (e.g. through the embedded impact values described above). Digital multimedia items generally comprise any combination of two or more of the following elements: text, image, sound, speech, video, computer programs and rendering or presentment information. Each digital multimedia item is usually processed by a programmable device as a function of item file, protocol and/or format.

Digital multimedia items may encompass a variety of different file formats and standards, and illustrative but not exhaustive examples include "WAVE" audio files, a format created by IBM Corporation and Microsoft Corporation, and "MPEG Audio Layer 3" or "MP3" music and spoken-text (e-books) files, which refers to a compression algorithm developed by the Fraunhofer Institute in Germany and later standardized by the Motion Picture Experts Group (MPEG), generally known to permit audio files to be highly compressed and yet retain excellent levels of quality; MPEG-1, a basic standard for video compact disc (CD) and MP3; MPEG-2, a standard for digital television set top boxes and digital video disc (DVD); MPEG-4, a standard for multimedia for fixed and mobile internet web content; MPEG-7, a standard for description and search of audio and visual content; MPEG-21, a multimedia framework); DivX®, a video encode/decode (codec) format developed by DivXNetworks, Inc. based on MPEG-4 (DIVX is a trademark of DivX, Inc. in the United States and/or other countries); XviD, an open source video codec based on MPEG-4; Overdrive™ and Kindle® digital text and e-book files (OVERDRIVE is a trademark of OverDrive, Inc. in the United States and/or other countries; KINDLE is a trademark of Amazon, Inc. in the United States and/or other countries); and other digital broadcast and multimedia stream formats known to one skilled in the art.

According to the present invention, each item may receive environmental impact determinations, ratings and labels according to algorithms specific and differentiated by medium type as well as by a type of production of the content (e.g. through algorithms specific to each of TV, radio, and Internet broadcast streams and files). Digital labels may also be digitally signed using known cryptography and signature methods, for example in order to prevent tampering or digital label forgery.

Digital environmental impact labeling may comprehend carbon footprint values, for example expressed as a weight of carbon dioxide determined to be generated by the energy observations and inputs. For physical, tangible information-carrying multimedia storage media (e.g. compact discs, digital video discs, audio books and tapes, a flash memory device, etc.), impact values may be a function of the energy used by or carbon footprints of each medium carrier required to transmit, ship or physically deliver and/or dispose of or recycle the media, in one aspect through an algorithm taking into account an energy-per-medium example needed to produce, transport or dispose/recycle of the medium, further also including an energy per medium carrier required to produce content of the medium. For intangible media (e.g. a radio broadcast to a radio receiver, a streamed television program, a streamed radio program, a streamed internet broadcasting program, a streamed digital music file, etc.), an algorithm may include the energy to produce the radio broadcast of the medium (e.g. radio broadcast tower power) plus the energy per example of use required to produce content of the medium (e.g. 20 people were required to drive to a studio to produce the show).

Media production energy costs and other impacts may also comprehend specific means used to create the digital content. For example, audio/video content produced by fewer people or fewer devices may be intrinsically more energy efficient than content requiring more people and/or devices in production or provision. Thus, one person producing a digital music or audio/visual item with a synthesizer or computer application may have a lower energy or carbon footprint than another item created by a band of musicians playing a plurality of instruments or by a plurality of graphic artists each using independent media supplies, when the energy used for each instrument and media supply by each person is considered. The amount of energy used by each performer, artist, producer or other content creator used to create content within the audio/visual music data may also be considered, e.g. energy used for transportation to a studio, or for lodging and hotel energy expenditures, etc. Thus, a first digital song file created by a single musician with a single instrument may be determined to have less environmental impact than a second song recorded by plurality of musicians, with an embedded label of each reflecting different total amounts of energy used by musical instruments. In another example, two streamed or broadcast news programs may have different impact labeling values differentiated as a function of divergent overall production energy costs involved with the personal performing or executing each program.

Embedded impact data may also be calculated as a function of dissemination. In one example, a broadcast emanating from a first high-power broadcast system may have a larger environmental impact than one from a second, relatively lower-powered system, or from a third system having a comparable power usage requirement as the first but wherein some or all of the power is supplied by a cleaner or lower-impact power supplier (e.g. provided by a wind, solar, biomass or renewable energy source supplier). Thus, according to the present invention, embedded impact values may also be determined as a function of an amount of energy used by a broadcaster or other disseminating entity to broadcast/provide a digital multimedia item, for example wherein the type or amount of energy used in the provision/broadcast is specified by embedded environmental impact label information.

Environmental impact calculations may vary by medium. For example, TV program broadcast impacts may be determined through different calculation methods and processes relative to those for downloaded MP3 files. Illustrative but not exhaustive examples of measurable factors useful for calculating environmental impacts according to the present invention include broadcast energy consumed, renewable energy displacements, energy required to create media, carbon offset provided by media producers, computational power used in creating, disseminating or distributing the digital content, and other examples will be apparent to one skilled in the art.

Digital labels may comprise tags, metadata, and other digital marking data as will be appreciated by one skilled in the art, each of which are embedded directly into digital multimedia items. Digital multimedia broadcasts may embed digital labels or tags within a media stream that give an indication of an item's environmental impact rating or value. Additionally, if a broadcast or program is based upon or includes a particular digital content item (e.g. an MP3 file) which comprises its own embedded environmental impact label, the embedded data within the included item may be added to or otherwise used in determining and embedding a value label for the broadcast itself.

Figure 2:
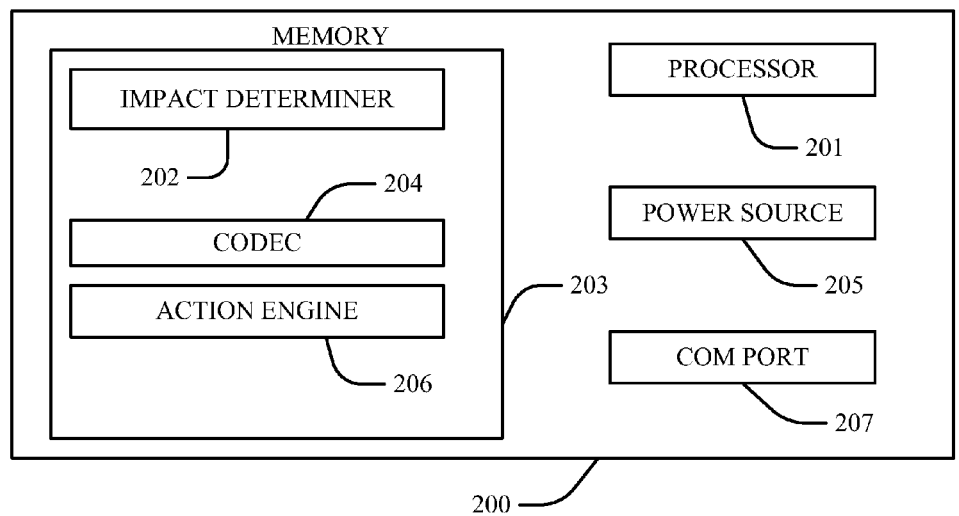
FIG. 2 is a block diagram of a system or device configured to enable the use of a digital multimedia item as a function of embedded environmental impact data according to the present invention.

By providing consumers with access to embedded labels or other data formats users of systems configured pursuant to the present invention may be encouraged to participate in energy-efficient use of digital multimedia and to adopt energy-efficient products. Thus, an item receiver is enabled to receive, use, select or reject a disseminated multimedia item as a function of the embedded impact data, manually or automatically. FIG. 2 illustrates a programmable device or module 200 configured to enable the use, or automatically process, digital media as a function of environmental impact data according to the present invention, for example as illustrated in FIG. 1 and described above. The device 200 may be incorporated into a larger system (such as one provided by a service provider) wherein other applications and components of the larger system accomplish systems and methods according to the present invention, or it may be a stand-alone device or module 200 configured to perform each of the systems and methods described above. The present embodiment comprises a central processing unit (CPU) or other processing means 201 in communication with a memory 203 comprising logic components that enable the CPU 201 to perform processes and methods according to the present application, as will be understood through reference to FIG. 1 as discussed above. Thus, the memory 203 comprises an impact determiner logic component 202 configured to account for an amount of energy or type of energy used in the creating (and optionally also the dissemination/broadcast) of a digital multimedia item; an embedding or decoding encoder/decoder (codec) logic component 204 configured to embed an environmental impact value within digital data of the item or to decode an environmental impact value embedded within a received digital item; and an action engine logic component 206 configured to notify and enable an action selection by a receiving user or other entity, or to automatically take an action, as a function of a decoded embedded environmental impact value.

A power unit 205 is configured to provide operative power to the device 200; examples include battery units 205 and power inputs configured to receive alternating or direct current electrical power, and other appropriate power units 205 will be apparent to one skilled in the art. A communication port or network link/node means ("com port") 207 is also provided and configured to receive or transmit the digital multimedia item, as well as to the enable data and other communications with carbon offset and carbon credit providers, and other devices, systems and monitoring, administrative and service provider entities as may be appropriate.

Figure 3:
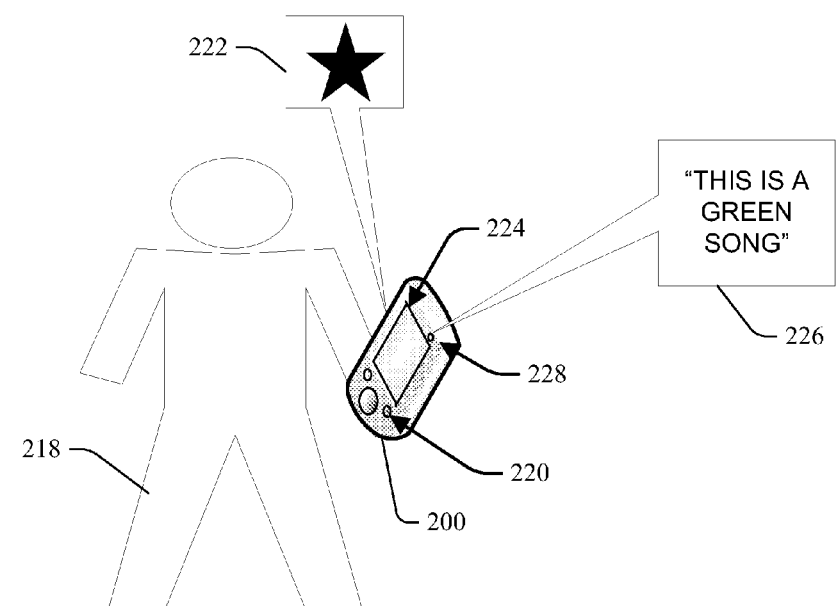
FIG. 3 is a diagrammatic illustration of a device configured to enable the use of a digital multimedia item as a function of embedded environmental impact data according to the present invention.

Referring now to FIG. 3, in one embodiment, a device 200 is configured by a user or provider to receive broadcast, satellite or internet radio programming and to filter-out or automatically omit or skip over broadcasts having high embedded environmental impact values (e.g. those having a value above a threshold setting), the device 200 presenting only "green" stations and broadcasts (e.g. those that do not exceed the threshold setting) to a user 218. The radio 200 may also provide notice to a listener or other user 218 of embedded environmental impact values, enabling the user 218 to manually select to receive and use or reject a given item as a function of the notice. For example, a green or other colored light 220 may be triggered on the device 200 to indicate a degree of environmental impact indicated by decoding embedded label value(s) of a digital multimedia item or program. An environmental impact logo 222 may also be provided with a device video display 224, the logo 222 a green lamp, graphic stamp or other overlaying logo or icon provided within a display of the item (e.g. overlaying an MP3 file album cover art display or over a displayed video file content) or otherwise embedded within a video, TV show or other program, automatically inserted into the display 224 content as a function of decoding embedded environmental impact data present in an item or transmission thereof.

Embeds for digital items (or their information as formatted and presented to a listening receiver 218) may also include distinctive sounds and audio messages 226 presented through a device audio speaker or presenting component 228 indicative of an embedded impact value. A distinctive sound 226 may include a tone, beep or other unique sound file played audibly to the device user 218; in one embodiment, a first distinctive chime 226 signifies a low-impact or green item, and a second different distinct foghorn or warning sound 228 signifies a second high-impact or high-energy production item. In another example, an audio message 226 embedded (or retrieved or created as a function of embedded impact values) is played to the listener 218; for example, a recorded or computer-generated voice may introduce audio content by stating an impact rating or level (e.g. "this is a green-rated song," "this is a yellow-rated impact broadcaster," "this is a level-three program that may require carbon offsetting to utilize," etc.) In this fashion, the user 218 is presented with auditory or visual notice of the impact values of each offered item in order to make an informed choice in selecting and using (e.g. watching, listening to, downloading, etc.) presented items or programs having lower environmental impact values.

According to the present invention, a radio station's power rating may be computed and impact values embedded within the station broadcast data. Some broadcasts and broadcasters may require more power than others, and it is known that some low-power community stations are able to provide program broadcasting at lower values than other stations. In one example, a process or system according to the present invention determines (e.g. at 02 and/or 04 of FIG. 1) that a first radio station is using 250 watts of power to broadcast a signal, and accordingly inserts or embeds (e.g. at 06 of FIG. 1) a metadata tag of "Power=250" into a broadcast stream from the first station. A radio (e.g. the device 200 of FIGS. 2 and 3) configured according to the present invention receiving the broadcast stream parses the stream to find and decode the metadata tag "Power=250" (e.g. at 08 and 10 of FIG. 1), takes a responsive action (e.g. at 12 of FIG. 1), which may include skipping or omitting the station from received stations presented to a listener 218, or provide a graphical indication of the station's environmental impact through indicator lights 220 or displays 224 so that the user 218 can make a decision as to whether the user wants to listen to the station. Broadcast and broadcaster impact values may also reflect energy source and use type; for example, if wind or other low-impact energy types are used to power a first broadcast an embedded metatag "PowerType=Wind" may be provided (e.g. at 08 and 10 of FIG. 1). In another example, a radio receiver 200 may be configured to decode Radio Data Stream (RDS) information, which enables broadcasters to transmit additional types of information via encoded digital signals within audio-video broadcast content that may be received and displayed by the radio receiver 200; for example, an RDS-capable radio 200 may display the title and artist of a current song as well as embedded environmental impact value information in a graphic format, for example as described above and elsewhere herein.

Embedded labels may be used as automatic triggers for carbon offsetting activities. Thus, an embedded environmental impact code in a broadcast signal may be received and decoded by a receiver (e.g. the user or listener/viewer's device 200 of FIGS. 2 and 3), resulting in the device 200 automatically sending a carbon offset signal to a carbon offset provider by the receiving device, in some examples triggering a purchase of an amount of carbon offset or a service (e.g. planting a tree to act as a carbon sink) from an offset provider by the user or a producer of the item, and wherein the amount of offset purchased may be determined as a function of the embedded environmental impact value.

II. Computerized Implementation

Figure 4:
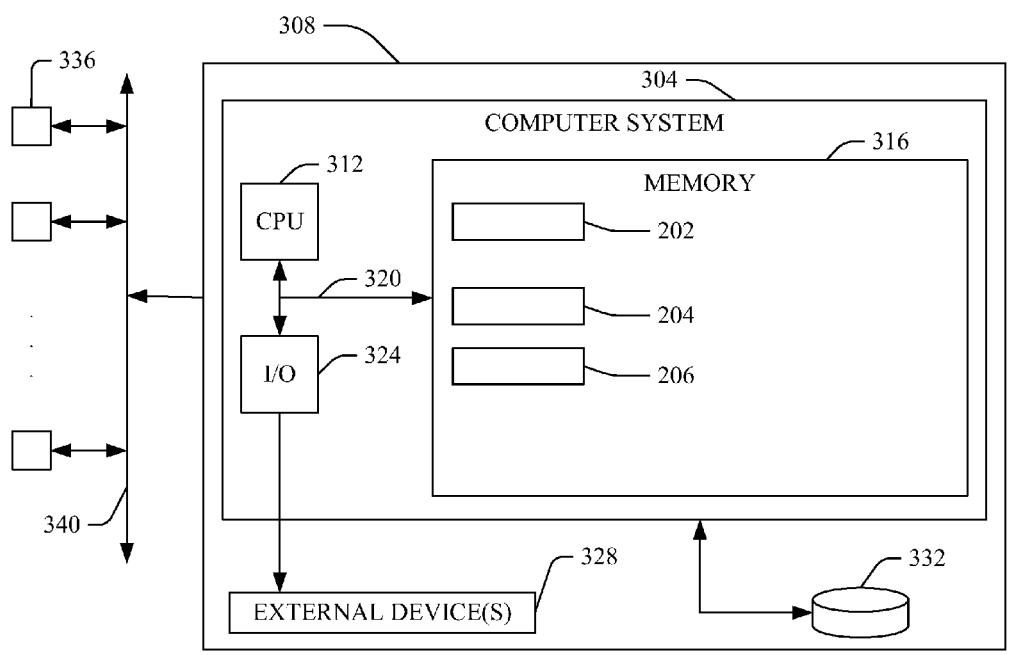
FIG. 4 is a block diagram illustrating a computerized implementation of a method and system for utilizing digital media as a function of embedded environmental impact data according to the present invention.

Referring now to FIG. 4, an exemplary computerized implementation of the present invention includes a computer system 304 deployed within a computer infrastructure 308 for example as a computer or a programmable device such as a personal digital assistant (PDA) or cellular phone. This is intended to demonstrate, among other things, that the present invention could be implemented within a network environment 340 (e.g., the Internet, a wide area network (WAN), a local area network (LAN), a virtual private network (VPN), etc.) in communication with one or more additional computers 336, or on a stand-alone computer infrastructure 308. In the case of the former, communication throughout the network 340 can occur via any combination of various types of communication links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet.

As shown, the computer system 304 includes a central processing unit (CPU) 312, a memory 316, a bus 320, and input/output (I/O) interfaces 324. Further, the computer system 304 is shown in communication with external I/O devices/resources 328 and storage system 332. In general, the processing unit 312 executes computer program code, such as the code to implement various components of the process and systems, and devices as illustrated in FIGS. 1-3 and described above, including the impact determiner logic component 202, the codec logic component 204, and action engine logic component 206 discussed above, and which are stored in memory 316 and/or storage system 332. It is to be appreciated that two or more, including all, of these components may be implemented as a single component.

While executing computer program code, the processing unit 312 can read and/or write data to/from the memory 316, the storage system 332, and/or the I/O interfaces 324. The bus 320 provides a communication link between each of the components in computer system 304. The external devices 328 can comprise any devices (e.g., keyboard, pointing device, display, etc.) that enable a user to interact with computer system 304 and/or any devices (e.g., network card, modem, etc.) that enable computer system 304 to communicate with one or more other computing devices.

The computer infrastructure 308 is only illustrative of various types of computer infrastructures for implementing the invention. For example, in one embodiment, computer infrastructure 308 comprises two or more computing devices (e.g., a server cluster) that communicate over a network to perform the various process steps of the invention. Moreover, computer system 304 is only representative of various possible computer systems that can include numerous combinations of hardware.

To this extent, in other embodiments, the computer system 304 can comprise any specific purpose-computing article of manufacture comprising hardware and/or computer program code for performing specific functions, any computing article of manufacture that comprises a combination of specific purpose and general-purpose hardware/software, or the like. In each case, the program code and hardware can be created using standard programming and engineering techniques, respectively. Moreover, the processing unit 312 may comprise a single processing unit, or be distributed across one or more processing units in one or more locations, e.g., on a client and server. Similarly, the memory 316 and/or the storage system 332 can comprise any combination of various types of data storage and/or transmission media that reside at one or more physical locations.

Further, I/O interfaces 324 can comprise any system for exchanging information with one or more of the external device 328. Still further, it is understood that one or more additional components (e.g., system software, math co-processing unit, etc.) not shown in FIG. 4 can be included in computer system 304. However, if computer system 304 comprises a handheld device or the like, it is understood that one or more of the external devices 328 (e.g., a display) and/or the storage system 332 could be contained within computer system 304, not externally as shown.

The storage system 332 can be any type of system (e.g., a database) capable of providing storage for information under the present invention. To this extent, the storage system 332 could include one or more storage devices, such as a magnetic disk drive or an optical disk drive. In another embodiment, the storage system 332 includes data distributed across, for example, a local area network (LAN), wide area network (WAN) or a storage area network (SAN) (not shown). In addition, although not shown, additional components, such as cache memory, communication systems, system software, etc., may be incorporated into computer system 304.

While shown and described herein as a method and a system, it is understood that the invention further provides various alternative embodiments. For example, in one embodiment, the invention provides a computer-readable/useable medium that includes computer program code to enable a computer infrastructure to implement methods, systems and devices according to the present application, for example as illustrated in FIGS. 1-4 above and described otherwise herein. To this extent, the computer-readable/useable medium includes program code that implements each of the various process steps of the present application.

It is understood that the terms "computer-readable medium" or "computer useable medium" comprise one or more of any type of physical embodiment of the program code. In particular, the computer-readable/useable medium can comprise program code embodied on one or more portable storage articles of manufacture (e.g., a compact disc, a magnetic disk, a tape, etc.), on one or more data storage portions of a computing device, such as the memory 316 and/or the storage system 332 (e.g., a fixed disk, a read-only memory, a random access memory, a cache memory, etc.).

Still yet, computer infrastructure 308 is intended to demonstrate that some or all of the components of implementation according to the present application could be deployed, managed, serviced, etc. by a service provider who offers to implement, deploy, and/or perform the functions of the present invention for others, for example by licensing methods and browser or application server technology to an internet service provider (ISP) or a cellular telephone provider. In one embodiment, the invention may comprise a business method that performs the process steps of the invention on a subscription, advertising, and/or fee basis. Thus, a service provider can create, maintain, support, etc., a computer infrastructure, such as the computer infrastructure 308 that performs the process steps of the present application for one or more customers, and in return the service provider can receive payment from the customer(s) under a subscription and/or fee agreement and/or the service provider can receive payment from the sale of advertising content to one or more third parties.

In still another embodiment, the invention provides a computer-implemented method for enabling the processes, methods and devices according to the present application. In this case, a computer infrastructure, such as computer infrastructure 308, can be provided and one or more systems for performing the process steps of the invention can be obtained (e.g., created, purchased, used, modified, etc.) and deployed to the computer infrastructure. To this extent, the deployment of a system can comprise one or more of: (1) installing program code on a computing device, such as computer system 304, from a computer-readable medium; (2) adding one or more computing devices to the computer infrastructure; and (3) incorporating and/or modifying one or more existing systems of the computer infrastructure to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after either or both of the following: (a) conversion to another language, code or notation; and/or (b) reproduction in a different material form. To this extent, program code can be embodied as one or more of: an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A computer implemented method for providing digital media content with an embedded environmental impact data value, the method comprising executing on a central processing unit the steps of:
    determining a first environmental impact value for a first digital multimedia item that comprises a tangible machine-readable article and a digital multimedia file stored thereon as a total of an amount of energy used in creating the first digital multimedia item, an amount of energy used to physically deliver the tangible machine-readable article to a user, and an amount of energy used to recycle or dispose of the tangible machine-readable article;
    encoding the determined first environmental impact value; and
    embedding the encoded first environmental impact value within digital data stored on the first digital multimedia item for decoding by a receiver of the first digital multimedia item.

2. The method of claim 1, further comprising:
    receiving a second digital multimedia item comprising a second embedded environmental impact value;
    decoding the second embedded environmental impact value;
    determining an amount of carbon offset as a function of the second embedded item environmental impact value; and
    triggering a purchase of the amount of a carbon offset from an offset provider.

3. The method of claim 1, wherein the first digital multimedia item environmental impact value is a carbon footprint expressed as a weight of carbon dioxide.

4. The method of claim 1, wherein the first digital multimedia item comprises music data; and wherein the step of determining the first digital multimedia item environmental impact value comprises determining the first digital multimedia item environmental impact value as a total of the amount of energy used in creating the first digital multimedia item, the amount of energy used to physically deliver the tangible machine-readable article to the user, the amount of energy used to recycle or dispose of the tangible machine-readable article, and at least one of:
    a total amount of energy used by each of at least one musical instrument to create the music data; and
    a total amount of energy used by each of at least one content creator in creating first digital multimedia item music content data.

5. The method of claim 1, wherein the tangible machine-readable article is a compact disc, a digital video disc, or a flash memory device.

6. The method of claim 1, further comprising:
    receiving another digital multimedia item comprising another embedded environmental impact value;
    decoding the received another embedded environmental impact value;
    receiving a third digital multimedia item comprising a third embedded environmental impact value;
    decoding the third embedded environmental impact value; and
    choosing the third item or the another item having a lower value of the decoded third environmental impact value and the decoded another environmental impact value.

7. The method of claim 6, wherein the third item and the another item are streamed multimedia broadcast program items, further comprising determining the environmental impact values for the third and the another item as at least one of:
    an amount of energy used by a broadcaster to broadcast the presented third and another program item to a user; and
    a type of energy used by the broadcaster to broadcast the third and another presented program item to a user.

8. The method of claim 7 wherein the third program item and the another program item are each at least one of a streamed television program, a streamed radio program, a streamed internet broadcasting program and a streamed digital music file.

9. The method of claim 8, further comprising:
conveying the decoded third program item environmental impact value and the another decoded program item environmental impact value to the user; and
offering a broadcast of the third program item or of the another program item to the user.

10. The method of claim 8, further comprising:
illuminating an indicator lamp in association with receiving a one of the third item and the another item that has a lower decoded environmental value;
displaying an environmental impact logo within a visual display of content of a one of the third item and the another item that has a lower decoded environmental value; and
audibly playing a distinctive sound indicative of the decoded embedded value of a one of the third item and the another item that has a lower decoded environmental value.

11. The method of claim 8, further comprising:
omitting a one of the third item and the another item from a presentation of digital items to the user in response to the omitted one of the third item and the another item having at least one of:
an embedded environmental impact value that is above a threshold; and
an embedded environmental impact value that is higher than an embedded environmental impact value of another of the third item and the another item.

12. The method of claim 1, further comprising:
integrating computer-readable program code into a computer system comprising the central processing unit, a computer readable memory and a computer readable tangible storage device, wherein the computer readable program code is embodied on the computer readable tangible storage device; and
wherein the computer readable program code comprises instructions for execution by the central processing unit via the computer readable memory that cause the central processing unit to perform the steps of determining the first environmental impact value for the first digital multimedia item, encoding the determined first environmental impact value and embedding the encoded first environmental impact value within the digital data of the first digital multimedia item for decoding.

13. A programmable device comprising:
a central processing unit;
a computer-readable memory in communication with the central processing unit; and
a tangible computer-readable storage device in communication with the central processing unit and the computer-readable memory;
wherein the central processing unit executes program instructions stored on the tangible computer-readable storage device via the computer readable memory:
determines a first environmental impact value for a first digital multimedia item that comprises a tangible machine-readable article and a digital multimedia file stored thereon as a total of an amount of energy used in creating the first digital multimedia item, an amount of energy used to physically deliver the tangible machine-readable article to a user, and an amount of energy used to recycle or dispose of the tangible machine-readable article;
encodes the determined first environmental impact value; and
embeds the encoded first environmental impact value within digital data stored on the first digital multimedia item for decoding by a receiver of the first digital multimedia item.

14. The programmable device of claim 13, wherein the central processing unit executes the program instructions stored on the computer-readable storage device via the computer readable memory, and thereby further presents a user with a choice of using a received third digital media item or another received digital media item by at least one of:
illuminating an indicator lamp in association with receiving a one of the third digital media item and the another digital media item that has a lower decoded environmental value;
displaying an environmental impact logo within a visual display of content of a one of the third digital media item and the another digital media item that has a lower decoded environmental value; and
audibly playing a distinctive sound indicative of the decoded embedded value of a one of the third digital media item and the another digital media item that has a lower decoded environmental value.

15. The programmable device of claim 13, wherein the first digital multimedia item environmental impact value is a carbon footprint expressed as a weight of carbon dioxide.

16. The programmable device of claim 13, wherein the first digital multimedia item comprises music data; and wherein the central processing unit executes the program instructions stored on the computer-readable storage device via the computer readable memory, and thereby determines the first digital multimedia item environmental impact value as a total of the amount of energy used in creating the first digital multimedia item, the amount of energy used to physically deliver the tangible machine-readable article to the user, the amount of energy used to recycle or dispose of the tangible machine-readable article, and at least one of:
a total amount of energy used by each of at least one musical instrument to create the music data; and
a total amount of energy used by each of at least one content creator in creating first digital multimedia item music content data.

17. A computer program product for providing digital media content with an embedded environmental impact data value, the computer program product comprising:
a computer readable tangible storage device having computer readable program cod embodied therewith, wherein the computer readable tangible storage device is not a transitory signal per se, the computer readable program code comprising instructions for execution by a computer central processing unit, that cause the computer central processing unit to:
determine a first environmental impact value for a first digital multimedia item that comprises a tangible machine-readable article and a digital multimedia file stored thereon as a total of an amount of energy used in creating the first digital multimedia item, an amount of energy used to physically deliver the tangible machine-readable article to a user, and an amount of energy used to recycle or dispose of the tangible machine-readable article;
encode the determined first environmental impact value; and
embed the encoded first environmental impact value within digital data stored on the first digital multimedia item for decoding by a receiver of the first digital multimedia item.

18. The computer program product of claim 17, wherein the computer readable program code instructions for execution by the computer central processing unit, further cause the computer central processing unit to:
- receive another digital multimedia item comprising another embedded environmental impact value;
- decode the received another embedded environmental impact value;
- receive a third digital multimedia item comprising a third embedded environmental impact value;
- decode the third embedded environmental impact value; and
- choose the third item or the another item having a lower value of the decoded third environmental impact value and the decoded another environmental impact value.

19. The computer program product of claim 17, wherein the third item and the another item are streamed multimedia broadcast program items, and wherein the computer readable program code instructions for execution by the computer central processing unit, further cause the computer central processing unit to:
- calculate the environmental impact values for the third and the another item by at least one of:
  - measuring an amount of energy used by a broadcaster to broadcast the presented third and another program item to a user; and
  - identifying a type of energy used by the broadcaster to broadcast the third and another presented program item to a user.

20. The computer program product of claim 19, wherein the third program item and the another program item are each at least one of a streamed television program, a streamed radio program, a streamed internet broadcasting program and a streamed digital music file; and
- wherein the computer readable program code instructions for execution by the computer central processing unit, further cause the computer central processing unit to:
- illuminate an indicator lamp in association with receiving a one of the third item and the another item that has a lower decoded environmental value;
- display an environmental impact logo within a visual display of content of a one of the third item and the another item that has a lower decoded environmental value; and
- audibly play a distinctive sound indicative of the decoded embedded value of a one of the third item and the another item that has a lower decoded environmental value.

* * * * *